(12) United States Patent
Chen et al.

(10) Patent No.: US 10,420,247 B2
(45) Date of Patent: Sep. 17, 2019

(54) CONNECTING ASSEMBLY FOR RACK SYSTEM

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Zong-Sian Wong, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 21 days.

(21) Appl. No.: 15/854,065

(22) Filed: Dec. 26, 2017

(65) Prior Publication Data
US 2019/0008069 A1    Jan. 3, 2019

(30) Foreign Application Priority Data
Jun. 28, 2017   (TW) ................. 106121867

(51) Int. Cl.
H05K 7/14    (2006.01)
A47F 1/00    (2006.01)

(52) U.S. Cl.
CPC ............ *H05K 7/1491* (2013.01); *A47F 1/00* (2013.01)

(58) Field of Classification Search
CPC .... H05K 7/1491; H05K 7/1489; H05K 7/183; H05K 7/186; A47F 1/00; A47F 3/06; A47F 3/063
See application file for complete search history.

(56) References Cited

U.S. PATENT DOCUMENTS

| | | | | |
|---|---|---|---|---|
| 3,138,655 A | * | 6/1964 | Rajewski | G03B 17/50 16/256 |
| 4,353,518 A | * | 10/1982 | Taylor | H05K 7/1491 248/281.11 |
| 6,021,047 A | * | 2/2000 | Lopez | H02B 1/36 312/223.2 |
| 6,326,547 B1 | * | 12/2001 | Saxby | H02G 11/00 174/69 |
| 6,392,149 B1 | * | 5/2002 | Kim | H05K 7/1491 174/70 R |
| 6,600,665 B2 | | 7/2003 | Lauchner | |
| 6,854,605 B2 | * | 2/2005 | Wrycraft | H05K 7/1491 211/187 |
| 6,972,949 B1 | * | 12/2005 | Helgenberg | G06F 1/183 361/679.02 |

(Continued)

*Primary Examiner* — Ko H Chan
(74) *Attorney, Agent, or Firm* — Alan D. Kamrath; Mayer & Williams PC

(57) ABSTRACT

A rack system includes a carried object, a first cable management arm, a second cable management arm and a supporting base. The carried object is mounted to the rack through a pair of slide rail assemblies. The first cable management arm is detachably connected to one of the slide rail assemblies. The second cable management arm is pivotally connected to the first cable management arm. The second cable management arm is detachably connected to the carried object. The supporting base is attached to the carried object and configured to support at least one of the first cable management arm and the second cable management arm.

16 Claims, 6 Drawing Sheets

(56) References Cited

U.S. PATENT DOCUMENTS

| | | | |
|---|---|---|---|
| 7,189,924 B1* | 3/2007 | Popescu | H05K 7/1491 |
| | | | 174/69 |
| 7,473,846 B2* | 1/2009 | Doerr | H05K 7/1491 |
| | | | 174/68.3 |
| 7,594,628 B2* | 9/2009 | Yang | H05K 7/1491 |
| | | | 248/58 |
| 8,186,634 B2 | 5/2012 | Chen et al. | |
| 8,729,389 B2* | 5/2014 | Hallett | H05K 7/1491 |
| | | | 174/99 R |
| 9,144,174 B2 | 9/2015 | Chen et al. | |
| 9,383,038 B2 | 7/2016 | Chen et al. | |
| 2006/0081736 A1* | 4/2006 | Chen | H01R 9/2416 |
| | | | 248/68.1 |
| 2011/0100933 A1* | 5/2011 | Kitten | F16L 3/015 |
| | | | 211/1 |

* cited by examiner

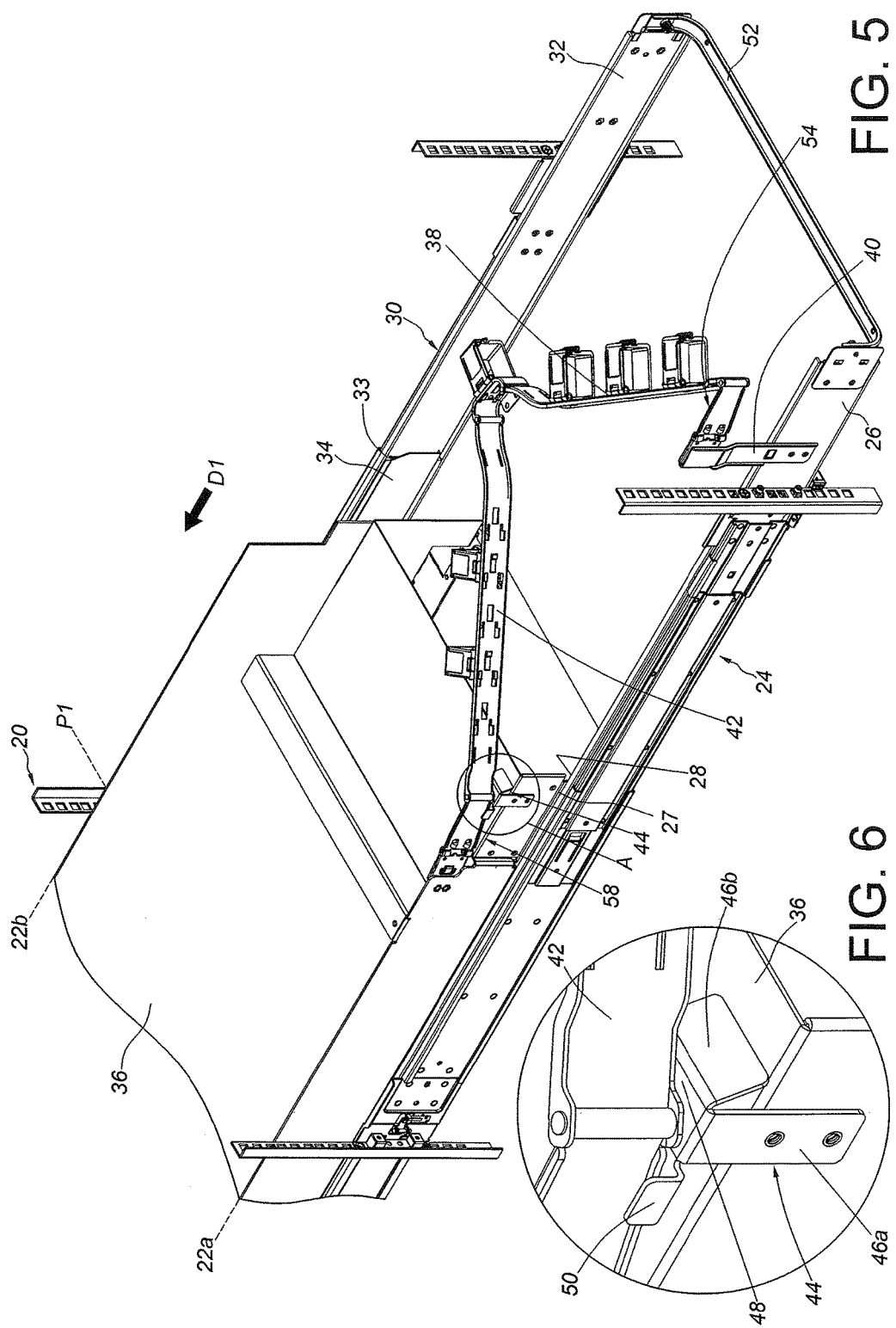

CONNECTING ASSEMBLY FOR RACK SYSTEM

BACKGROUND OF THE INVENTION

1. Field of the Invention

The present invention relates to a connecting assembly, and more particularly, to a connecting assembly for a rack system.

2. Description of the Prior Art

A rack system is a rack mounted with a server. Generally, two opposite sides of the server are respectively arranged with slide rail assemblies, such that the server can be mounted to the rack through the slide rail assemblies, in order to allow the server to be pulled out of the rack or to be pushed into the rack. The server is usually connected with electronic cables. When the server is pulled out of the rack or pushed into the rack through the slide rail assemblies, a cable management arm is required to hold and manage the cables neatly. U.S. Pat. Nos. 6,600,665 B2, 8,186,634 B2 and 9,144,174 B2 disclose related designs. The cases are provided for reference.

However, when the server has larger capacity, the server requires more cables, such that weight of the cables may exceed weight limit of the cable management arm. On the other hand, the overweight carried object may cause excessive load on the slide rail assemblies.

SUMMARY OF THE INVENTION

An objective of the present invention is to provide a connecting assembly for a rack system capable of providing better support for cables of a carried object mounted on a rack.

Another objective of the present invention is to provide a connecting assembly for a rack system capable of enhancing supporting structure for supporting the carried object mounted on the rack.

According to an embodiment of the present invention, a rack system comprises a rack, a first slide rail assembly, a second slide rail assembly, a carried object, a first cable management arm, a second cable management arm, and a supporting base. The rack has a first side and a second side. The first slide rail assembly is mounted to the first side of the rack. The first slide rail assembly at least comprises a first rail and a second rail, wherein the second rail is movable relative to the first rail. The second slide rail assembly is mounted to the second side of the rack. The second slide rail assembly at least comprises a third rail and a fourth rail, wherein the fourth rail is movable relative to the third rail. The carried object is mounted between the first slide rail assembly and the second slide rail assembly. The carried object is movable relative to the rack between a close position and an extension position through the second rail of the first slide rail assembly and the fourth rail of the second slide rail assembly. The first cable management arm is detachably connected to one of the rack, the first rail of the first slide rail assembly and the third rail of the second slide rail assembly. The second cable management arm is pivotally connected to the first cable management arm, and detachably connected to one of the carried object, the second rail of the first slide rail assembly and the fourth rail of the second slide rail assembly. The supporting base is attached to the carried object and configured to support at least one of the first cable management arm and the second cable management arm.

According to another embodiment of the present invention, a rack system comprises a rack, a first slide rail assembly, a second slide rail assembly, a carried object, a first cable management arm, a second cable management arm, and a linking member. The rack has a first side and a second side. The first slide rail assembly is mounted to the first side of the rack. The first slide rail assembly at least comprises a first rail and a second rail, wherein the second rail is movable relative to the first rail. The second slide rail assembly is mounted to the second side of the rack. The second slide rail assembly at least comprises a third rail and a fourth rail, wherein the fourth rail is movable relative to the third rail. The carried object is mounted between the first slide rail assembly and the second slide rail assembly. The carried object is movable relative to the rack between a close position and an extension position through the second rail of the first slide rail assembly and the fourth rail of the second slide rail assembly. The first cable management arm is detachably connected to one of the rack, the first rail of the first slide rail assembly and the third rail of the second slide rail assembly. The second cable management arm is pivotally connected to the first cable management arm, and detachably connected to one of the carried object, the second rail of the first slide rail assembly and the fourth rail of the second slide rail assembly. The linking member is detachably connected between the first rail of the first slide rail assembly and the third rail of the second slide rail assembly.

Preferably, the supporting base is fixedly attached to the carried object. The supporting base has a first supporting leg, a second supporting leg and a supporting part. The first supporting leg is fixedly mounted to a lateral side of the carried object, and the second supporting leg abuts against an upper side of the carried object. A first supporting height is defined between the supporting part and the upper side of the carried object.

Preferably, the supporting base has a blocking part configured to prevent the second cable management arm from being deflected away from the supporting base.

Preferably, the rack system further comprises a supporting frame fixedly mounted to one of the first rail of the first slide rail assembly and the third rail of the second slide rail assembly, wherein the supporting frame has a second supporting height greater than a height of each of the first rail of the first slide rail assembly and the third rail of the second slide rail assembly.

Preferably, the first cable management arm is arranged with a first connecting member. The supporting frame is arranged with a first corresponding member. The first connecting member is detachably connected to the first corresponding member.

Preferably, the first connecting member is movably connected to the first cable management arm.

Preferably, the second cable management arm is arranged with a second connecting member. The carried object is arranged with a second corresponding member. The second connecting member is detachably connected to the second corresponding member.

Preferably, the second connecting member is movably connected to the second cable management arm.

According to another embodiment of the present invention, a connecting assembly for a rack system comprises a first slide rail assembly, a second slide rail assembly, a linking member, a first cable management arm, and a second cable management arm. The first slide rail assembly at least comprises a first rail and a second rail, wherein the second rail is movable relative to the first rail. The second slide rail assembly at least comprises a third rail and a fourth rail, wherein the fourth rail is movable relative to the third rail. The linking member is connected between the first rail of the first slide rail assembly and the third rail of the second slide rail assembly. The first cable management arm is detachably connected to one of the first rail of the first slide rail assembly and the third rail of the second slide rail assembly. The second cable management arm is pivotally connected to the first cable management arm.

Preferably, the connecting assembly further comprises a supporting base attached to a carried object. The carried object is mounted between the first slide rail assembly and the second slide rail assembly. The supporting base is configured to support at least one of the first cable management arm and the second cable management arm.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a diagram showing the carried object being pulled out relative to a rack to move from the close position to a first position;

FIG. 6 is an enlarged view of an area A of FIG. 5; and

DETAILED DESCRIPTION

Figure 1:
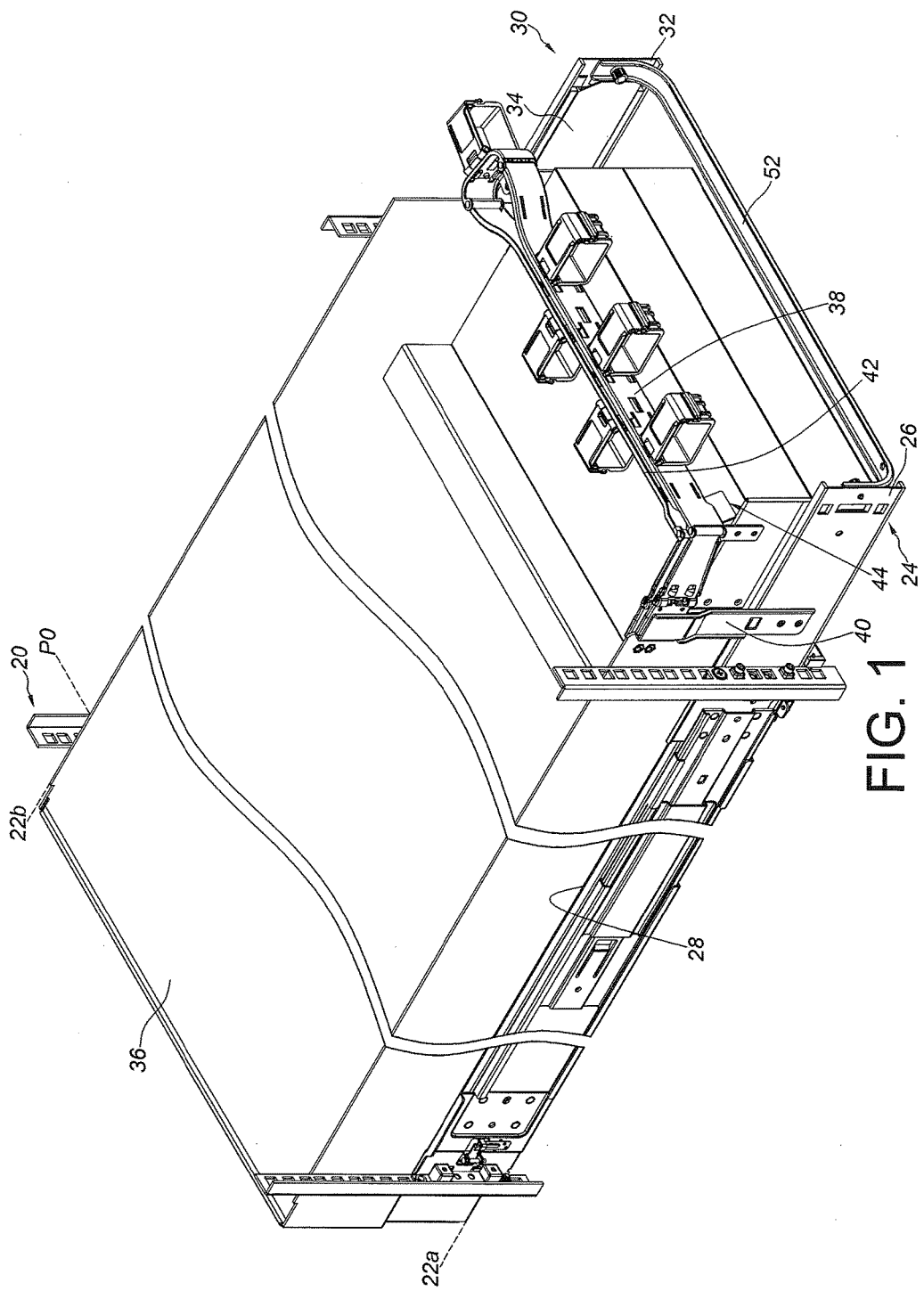
FIG. 1 is a diagram showing a rack system according to an embodiment of the present invention, wherein a carried object is located at a close position.

FIG. 1 to FIG. 4 are diagrams showing a rack system according to an embodiment of the present invention. The rack system comprises a rack 20, a first slide rail assembly 24, a second slide rail assembly 30, a carried object 36, and a first cable management arm 38. The rack 20 has a first side 22a and a second side 22b. The first slide rail assembly 24 is mounted to the first side 22a of the rack 20. The first slide rail assembly 24 at least comprises a first rail 26 and a second rail 28, wherein the second rail 28 is movable relative to the first rail 26. Preferably, the first slide rail assembly 24 further comprises a first middle rail 27 movably connected between the first rail 26 and the second rail 28 for extending a traveling distance of the second rail 28 relative to the first rail 26. The second slide rail assembly 30 is mounted to the second side 22b of the rack 20. Configuration of the second slide rail assembly 30 can be identical to configuration of the first slide rail assembly 24. The second slide rail assembly 30 at least comprises a third rail 32 and a fourth rail 34, wherein the fourth rail 34 is movable relative to the third rail 32. Preferably, the second slide rail assembly 30 further comprises a second middle rail 33 movably connected between the third rail 32 and the fourth rail 34 for extending a traveling distance of the fourth rail 34 relative to the third rail 32. The carried object 36 can contain a hard disk, a power distribution unit and/or other electronic components. The carried object 36 is mounted between the first slide rail assembly 24 and the second slide rail assembly 30. The carried object 36 is movable relative to the rack 20 between a close position (such as a front part P0 of the carried object 36 being adjacent to a front post of the rack 20) and an extension position (please refer to FIG. 5 and FIG. 7) through the second rail 28 of the first slide rail assembly 24 and the fourth rail 34 of the second slide rail assembly 30. The first cable management arm 38 is detachably connected to one of the rack 20, the first rail 26 of the first slide rail assembly 24, and the third rail 32 of the second slide rail assembly 30. In the present embodiment, the first cable management arm 38 is detachably connected to the first rail 26 of the first slide rail assembly 24 through a supporting frame 40. But the present invention is not limited thereto. The first cable management arm 38 can be connected to other fixed object.

Figure 7:
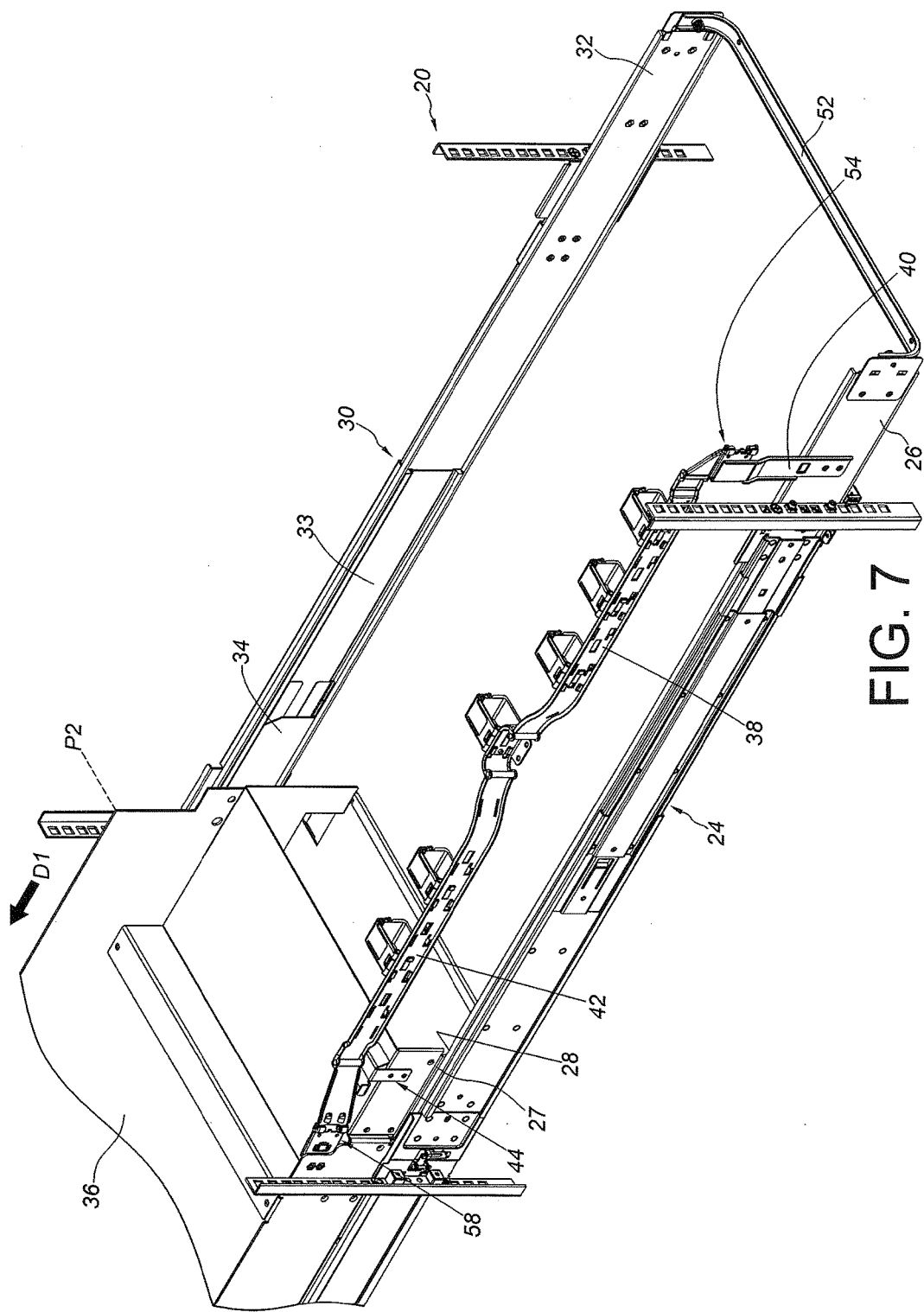
FIG. 7 is a diagram showing the carried object being pulled out relative to the rack to move from the close position to a second position.

Preferably, the rack system further comprises a second cable management arm 42 pivotally connected to the first cable management arm 38, such that the first cable management arm 38 and the second cable management arm 42 can be expanded (as shown in FIG. 5 and FIG. 7) or folded (as shown in FIG. 1). The second cable management arm 42 is detachably connected to one of the carried object 36, the second rail 28 of the first slide rail assembly 24, and the fourth rail 34 of the second slide rail assembly 30. In the present embodiment, the second cable management arm 42 is detachably connected to the carried object 36. But the present invention is not limited thereto. The second cable management arm 42 can be connected to other aforementioned movable object, such as the second rail 28 of the first slide rail assembly 24 or the fourth rail 34 of the second slide rail assembly 30.

Preferably, the rack system further comprises a supporting base 44 attached to the carried object 36 and configured to support one of the first cable management arm 38 and the second cable management arm 42 (for example, when the carried object 36 is located at extension position as shown in FIG. 5 and FIG. 7, the supporting base 44 is configured to support the second cable management arm 42), or configured to support both the first cable management arm 38 and the second cable management arm 42 (for example, when the carried object 36 is located at the close position as shown in FIG. 1, the supporting base 44 is configured to support both the first cable management arm 38 and the second cable management arm 42).

Preferably, the supporting base 44 is fixedly attached to the carried object 36. The supporting base 44 has a first supporting leg 46a, a second supporting leg 46b and a supporting part 48. The first supporting leg 46a is fixedly mounted to a lateral side of the carried object 36, and the second supporting leg 46b abuts against a plate member at an upper side of the carried object 36, such that a first supporting height h1 is defined between the supporting part 48 and the upper side of the carried object 36 (please refer to FIG. 3).

Preferably, as shown in FIG. 6, the supporting base 44 has a blocking part 50 configured to prevent the second cable management arm 42 from being deflected to an inappropriate position (such as being deflected to a position away from the supporting base 44 without being supported by the supporting base 44).

Preferably, the rack system further comprises a linking member 52 detachably connected between the first rail 26 of the first slide rail assembly 24 and the third rail 32 of the second slide rail assembly 30 in order to enhance supporting capability of the slide rail assemblies. In the present embodiment, a connecting assembly of the present invention comprises the first slide rail assembly 24, the second slide rail assembly 30, the linking member 52, the first cable management arm 38, the second cable management arm 42 and the supporting base 44.

Figure 4:
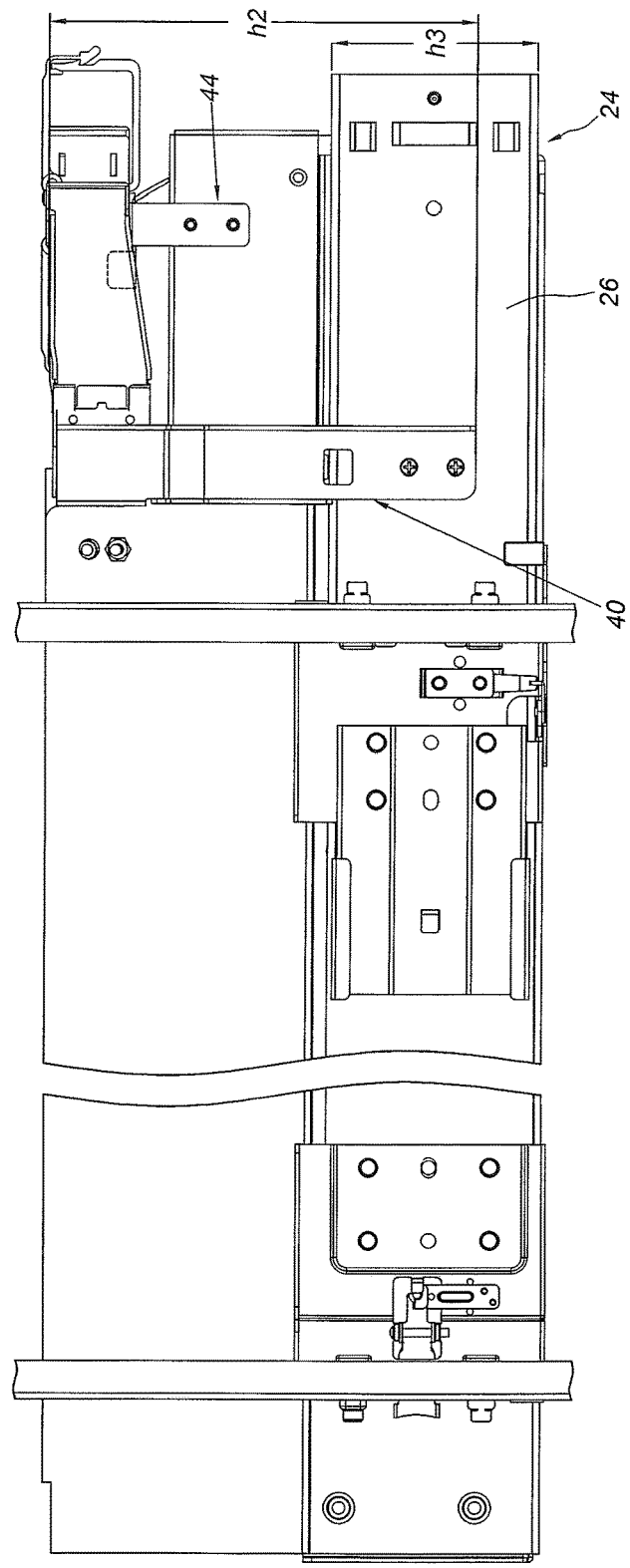
FIG. 4 is a lateral view of the rack system according to an embodiment of the present invention.

Preferably, the supporting frame 40 is fixedly mounted to one of the first rail 26 of the first slide rail assembly 24 and the third rail 32 of the second slide rail assembly 30. In the present embodiment, the supporting frame 40 is fixedly mounted to the first rail 26 of the first slide rail assembly 24. But the present invention is not limited thereto. In addition, as shown in FIG. 4, the supporting frame 40 has a second supporting height h2 greater than a height h3 of the first rail 26 of the first slide rail assembly 24.

Figure 2:
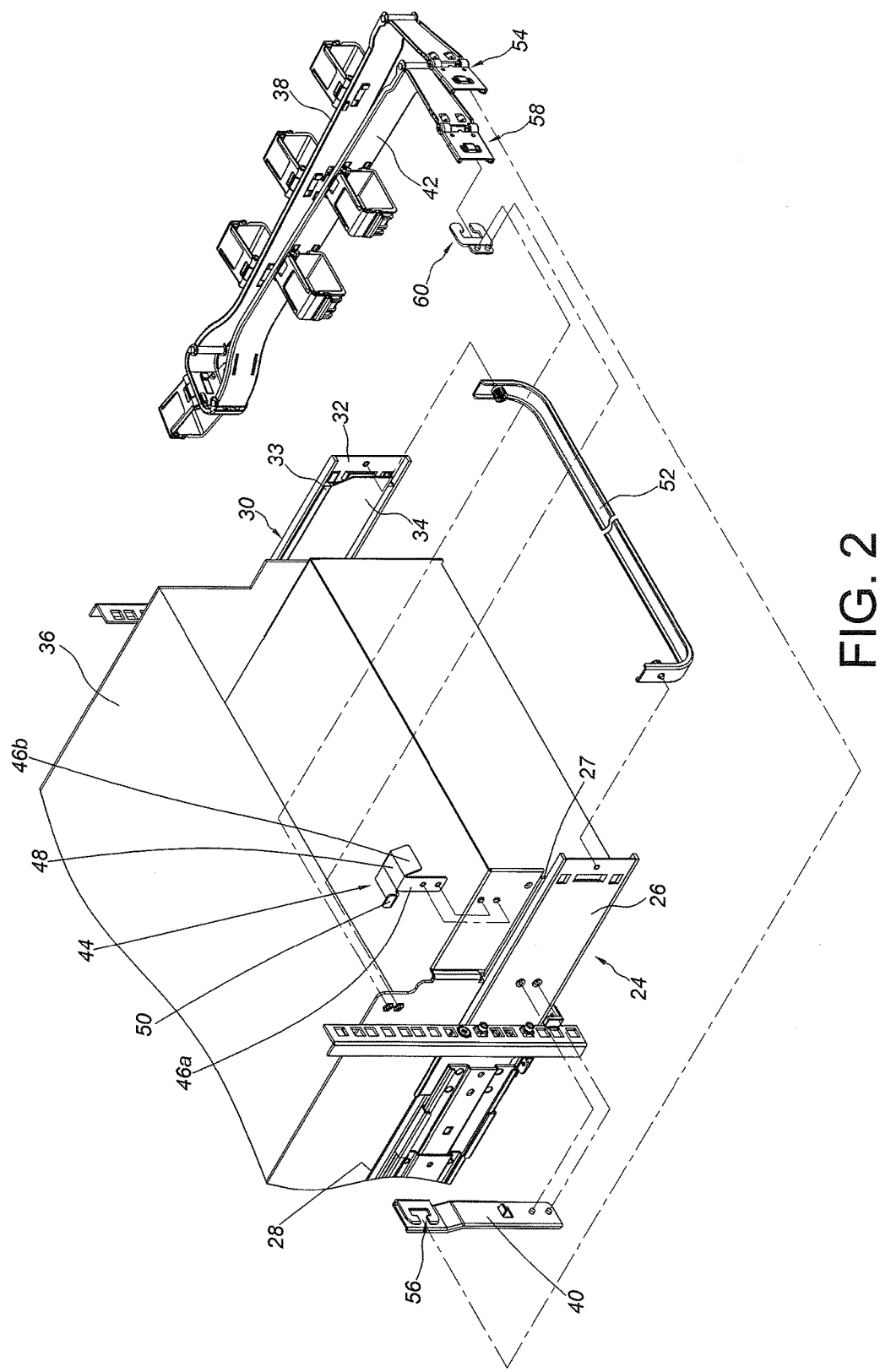
FIG. 2 is a partial exploded view of the rack system according to an embodiment of the present invention.
Figure 3:
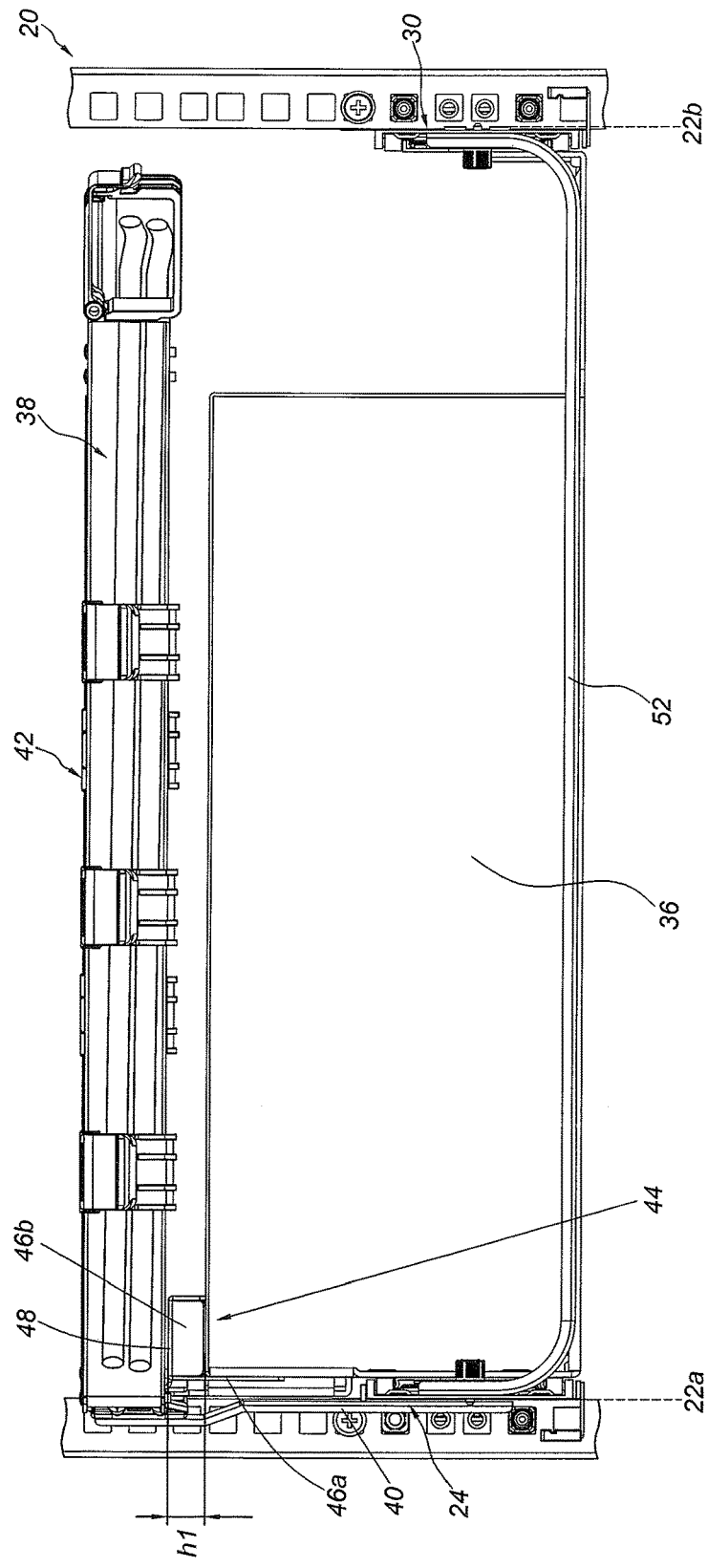
FIG. 3 is a rear view of the rack system according to an embodiment of the present invention.

Preferably, as shown in FIG. 2, the first cable management arm 38 is arranged with a first connecting member 54. The supporting frame 40 is arranged with a first corresponding member 56. The first connecting member 54 is detachably connected to the first corresponding member 56. Preferably, the first connecting member 54 is movably connected to the first cable management arm 38.

Preferably, as shown in FIG. 2, the second cable management arm 42 is arranged with a second connecting member 58. On the other hand, a second corresponding member 60 is fixedly mounted to the carried object 36. The second connecting member 58 is detachably connected to the second corresponding member 60. Preferably, the second connecting member 58 is movably connected to the second cable management arm 42.

As shown in FIG. 5 to FIG. 7, during a process of the carried object 36 being pulled out relative to the rack 20 to move from the closed position (as shown in FIG. 1) to an extension position (such as a middle part P1 of the carried object 36 being adjacent to the front post of the rack 20 shown in FIG. 5, or a rear part P2 of the carried object 36 being adjacent to the front post of the rack 20 shown in FIG. 7) along a first direction D1, the supporting base 44 is configured to support one of the first cable management arm 38 and the second cable management arm 42, in order to prevent the first cable management arm 38 and the second cable management arm 42 from leaning downward, which affects movement of the carried object 36 relative to the rack 20. On the other hand, since the linking member 52 is detachably connected between the first rail 26 of the first slide rail assembly 24 and the third rail 32 of the second slide rail assembly 30, overall supporting structure of the slide rail assemblies can be enhanced, such that an overweight carried object can be reliably supported without causing deformation of the slide rail assemblies.

Therefore, the rack system of the present invention is characterized in that:

1. Cables of the carried object mounted in the rack can be supported more reliably.

2. The supporting structure for supporting the carried object on the rack can be enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A rack system, comprising:
a rack having a first side and a second side;
a first slide rail assembly mounted to the first side of the rack, the first slide rail assembly at least comprising a first rail and a second rail, wherein the second rail is movable relative to the first rail;
a second slide rail assembly mounted to the second side of the rack, the second slide rail assembly at least comprising a third rail and a fourth rail, wherein the fourth rail is movable relative to the third rail;
a carried object mounted between the first slide rail assembly and the second slide rail assembly, the carried object being movable relative to the rack between a close position and an extension position through the second rail of the first slide rail assembly and the fourth rail of the second slide rail assembly;
a first cable management arm detachably connected to one of the rack, the first rail of the first slide rail assembly and the third rail of the second slide rail assembly;
a second cable management arm pivotally connected to the first cable management arm, and detachably connected to one of the carried object, the second rail of the first slide rail assembly and the fourth rail of the second slide rail assembly; and
a supporting base attached to the carried object and configured to support at least one of the first cable management arm and the second cable management arm, wherein the supporting base is fixedly attached to the carried object, the supporting base has a first supporting leg, a second supporting leg and a supporting part, the first supporting leg is fixedly mounted to a lateral side of the carried object, and the second supporting leg abuts against an upper side of the carried object, a first supporting height is defined between the supporting part and the upper side of the carried object.

2. The rack system of claim 1, further comprising a linking member detachably connected between the first rail of the first slide rail assembly and the third rail of the second slide rail assembly.

3. The rack system of claim 2, wherein the supporting base has a blocking part configured to prevent the second cable management arm from being deflected away from the supporting base.

4. The rack system of claim 1, further comprising a supporting frame fixedly mounted to one of the first rail of the first slide rail assembly and the third rail of the second slide rail assembly, wherein the supporting frame has a second supporting height greater than a height of each of the first rail of the first slide rail assembly and the third rail of the second slide rail assembly.

5. The rack system of claim 4, wherein the first cable management arm is arranged with a first connecting member, the supporting frame is arranged with a first corresponding member, and the first connecting member is detachably connected to the first corresponding member.

6. The rack system of claim 5, wherein the first connecting member is movably connected to the first cable management arm.

7. The rack system of claim 5, wherein the second cable management arm is arranged with a second connecting member, the carried object is arranged with a second corresponding member, and the second connecting member is detachably connected to the second corresponding member.

8. The rack system of claim 7, wherein the second connecting member is movably connected to the second cable management arm.

9. A rack system, comprising:

a rack having a first side and a second side;

a first slide rail assembly mounted to the first side of the rack, the first slide rail assembly at least comprising a first rail and a second rail, wherein the second rail is movable relative to the first rail;

a second slide rail assembly mounted to the second side of the rack, the second slide rail assembly at least comprising a third rail and a fourth rail, wherein the fourth rail is movable relative to the third rail;

a carried object mounted between the first slide rail assembly and the second slide rail assembly, the carried object being movable relative to the rack between a close position and an extension position through the second rail of the first slide rail assembly and the fourth rail of the second slide rail assembly;

a first cable management arm detachably connected to one of the rack, the first rail of the first slide rail assembly and the third rail of the second slide rail assembly;

a second cable management arm movably pivotally connected to the first cable management arm, and detachably connected to one of the carried object, the second rail of the first slide rail assembly and the fourth rail of the second slide rail assembly; and a linking member detachably connected between the first rail of the first slide rail assembly and the third rail of the second slide rail assembly;

wherein the rack system further comprises a supporting frame fixedly mounted to one of the first rail of the first slide rail assembly and the third rail of the second slide rail assembly; wherein the supporting frame has a supporting height greater than a height of each of the first rail of the first slide rail assembly and the third rail of the second slide rail assembly;

wherein the first cable management arm is arranged with a first connecting member, the supporting frame is arranged with a first corresponding member, and the first connecting member is detachably connected to the first corresponding member.

10. The rack system of claim 9, further comprising a supporting base attached to the carried object for supporting at least one of the first cable management arm and the second cable management arm.

11. The rack system of claim 10, wherein the supporting base is fixedly attached to the carried object, the supporting base has a first supporting leg, a second supporting leg and a supporting part, the first supporting leg is fixedly mounted to a lateral side of the carried object, and the second supporting leg abuts against an upper side of the carried object, another supporting height is defined between the supporting part and the upper side of the carried object.

12. The rack system of claim 11, wherein the supporting base has a blocking part configured to prevent the second cable management arm from being deflected away from the supporting base.

13. The rack system of claim 9, wherein the first connecting member is movably connected to the first cable management arm.

14. The rack system of claim 9, wherein the second cable management arm is arranged with a second connecting member, the carried object is arranged with a second corresponding member, and the second connecting member is detachably connected to the second corresponding member.

15. The rack system of claim 14, wherein the second connecting member is movably connected to the second cable management arm.

16. A connecting assembly for a rack system, comprising:

a first slide rail assembly at least comprising a first rail and a second rail, wherein the second rail is movable relative to the first rail;

a second slide rail assembly at least comprising a third rail and a fourth rail, wherein the fourth rail is movable relative to the third rail;

a linking member connected between the first rail of the first slide rail assembly and the third rail of the second slide rail assembly;

a first cable management arm detachably connected to one of the first rail of the first slide rail assembly and the third rail of the second slide rail assembly; and a second cable management arm pivotally connected to the first cable management arm;

wherein the connecting assembly further comprises a supporting base fixedly attached to a carried object wherein the carried object is mounted between the first slide rail assembly and the second slide rail assembly, and the supporting base is configured to support at least one of the first cable management arm and the second cable management arm; wherein the supporting base has a first supporting leg, a second supporting leg and a supporting part, the first supporting leg is fixedly mounted to a lateral side of the carried object, and the second supporting leg abuts against an upper side of the carried object, a supporting height is defined between the supporting part and the upper side of the carried object.

* * * * *